United States Patent
Inao et al.

(10) Patent No.: US 9,484,238 B2
(45) Date of Patent: Nov. 1, 2016

(54) ATTACHMENT METHOD

(71) Applicant: Tokyo Ohka Kogyo Co., Ltd., Kawasaki-shi (JP)

(72) Inventors: Yoshihiro Inao, Kawasaki (JP); Shigeru Kato, Kawasaki (JP); Yasumasa Iwata, Kawasaki (JP); Yasushi Fujii, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/439,430

(22) PCT Filed: Mar. 24, 2014

(86) PCT No.: PCT/JP2014/058078
§ 371 (c)(1),
(2) Date: Apr. 29, 2015

(87) PCT Pub. No.: WO2014/157082
PCT Pub. Date: Oct. 2, 2014

(65) Prior Publication Data
US 2016/0005635 A1    Jan. 7, 2016

(30) Foreign Application Priority Data
Mar. 29, 2013  (JP) .................... 2013-074261

(51) Int. Cl.
*H01L 21/683* (2006.01)
*H01L 21/67* (2006.01)
(Continued)

(52) U.S. Cl.
CPC ..... *H01L 21/6835* (2013.01); *H01L 21/67092* (2013.01); *H01L 21/67109* (2013.01);
(Continued)

(58) Field of Classification Search
CPC .............. H01L 21/68742; H01L 2221/683; H01L 2221/68318; H01L 2221/68324; H01L 2221/68381; H01L 21/683; H01L 21/67092; H01L 21/6835; B32B 37/10; B32B 37/1018; B24B 7/228; B24B 9/065
USPC ................ 156/581, 583.91, 228, 273.3, 312
See application file for complete search history.

(56) References Cited

U.S. PATENT DOCUMENTS

| | | | |
|---|---|---|---|
| 2002/0083849 A1 | 7/2002 | Ohta et al. | |
| 2007/0125495 A1 | 6/2007 | Nakamura et al. | |

(Continued)

FOREIGN PATENT DOCUMENTS

| | | |
|---|---|---|
| JP | 2002-192394 | 7/2002 |
| JP | A-2007-158122 | 6/2007 |

(Continued)

OTHER PUBLICATIONS

Office Action in Taiwanese Patent Application No. 103111245, mailed Dec. 16, 2015.

(Continued)

*Primary Examiner* — Carson Gross
(74) *Attorney, Agent, or Firm* — Knobbe Martens Olson & Bear LLP

(57) ABSTRACT

An attachment method including an overlapping step of overlapping a support plate over a substrate under a reduced pressure environment; a temporary fixing step of temporarily fixing the support plate to the substrate; and an attaching step of attaching the support plate to the substrate under a reduced pressure environment. The method further includes, prior to the overlapping step, at least one of a first heating step in which heating is performed under an atmospheric pressure environment and a second heating step in which heating is performed under a reduced pressure environment.

13 Claims, 4 Drawing Sheets

(51) Int. Cl.
*H01L 21/687* (2006.01)
*B24B 7/22* (2006.01)
*B24B 9/06* (2006.01)
*B32B 37/10* (2006.01)

(52) U.S. Cl.
CPC ......... *H01L21/68742* (2013.01); *B24B 7/228* (2013.01); *B24B 9/065* (2013.01); *B32B 37/10* (2013.01); *H01L 2221/68318* (2013.01); *H01L 2221/68327* (2013.01); *H01L 2221/68381* (2013.01)

(56) References Cited

U.S. PATENT DOCUMENTS

| | | | |
|---|---|---|---|
| 2010/0038035 A1* | 2/2010 | Noda | B32B 43/006 156/379.6 |
| 2012/0132359 A1 | 5/2012 | Nakamura et al. | |
| 2013/0071996 A1* | 3/2013 | Deguchi | B32B 38/0036 438/455 |
| 2014/0141253 A1 | 5/2014 | Fujii et al. | |

FOREIGN PATENT DOCUMENTS

| | | |
|---|---|---|
| JP | A-2008-166536 | 7/2008 |
| JP | A-2008-182127 | 8/2008 |
| JP | A-2012-49267 | 3/2012 |
| JP | A-2013-747 | 1/2013 |
| JP | A-2013-4609 | 1/2013 |
| TW | 201220418 | 5/2012 |
| WO | WO 2012/026334 | 3/2012 |
| WO | WO 2012/176607 | 12/2012 |

OTHER PUBLICATIONS

Notice of Allowance in corresponding Japanese Patent Application No. 2015-508482, dated Jun. 2, 2015.

International Search Report in PCT/JP2014/058078, dated Jun. 17, 2014.

International Preliminary Report on Patentability in corresponding International Application No. PCT/JP2014/058078, dated Oct. 1, 2015.

* cited by examiner

ATTACHMENT METHOD

This application is the U.S. National Phase under 35 U.S.C. §371 of International Application No. PCT/JP2014/058078 filed Mar. 24, 2014, designating the U.S., and published in Japanese as WO 2014/157082 on Oct. 2, 2014, which claims priority to Japanese Patent Application No. 2013-074261, filed Mar. 29, 2013, the entire content of which is incorporated herein by reference.

TECHNICAL FIELD

The present invention relates to an attachment method of attaching a support body to a substrate.

BACKGROUND ART

In recent years, there has been an increasing demand for high integration of chips in a package via size reduction and the thinning of mounted semiconductor silicon chips (hereinafter, referred to as chips) as the functionalities of a mobile phone, a digital AV device, an IC card, or the like are added. In an integrated circuit, for example, representatively a chip size package (CSP) or a multi-chip package (MCP), in which a plurality of chips are built into one package, the chip is required to be further thinned. It is necessary to reduce the thickness of a chip to a range of 25 µm to 150 µm so as to realize high integration of chips in a package.

Meanwhile, since a semiconductor wafer (hereinafter, referred to as a wafer), that is, a basis for a chip is thinned via grinding, the strength of the wafer becomes low, and a crack or warping is likely to occur. Since it is difficult to automatically transport wafers having low strength associated with the reduction of the thickness, the wafers are required to be manually transported, and the handling thereof is complicated.

Such a challenge has lead to the development of a wafer handling system in which it is possible to maintain the strength of a wafer, and to prevent occurrences of a crack and warping on the wafer by attaching a plate, a so-called support plate made of glass, silicon, hardened plastic, or the like to the wafer to be grinded. Since it is possible to maintain the strength of the wafer via the wafer handling system, it is possible to automate the transportation of thinned wafers.

In the wafer handling system, the support plate is attached to the wafer via an adhesive layer formed from an adhesive tape, thermoplastic resin, an adhesive, or the like.

PTL 1 discloses an attachment method and an attachment apparatus to perform the attachment operation, which includes a setting plate on which a substrate is set, a presser plate configured to press a support plate against the substrate, a pair of horizontally advanceable and retractable alignment members, in which a tip end portion of the alignment member is provided with a blade configured to support a lower surface of a circumferential edge portion of the support plate, and a presser member configured to position the substrate and the support plate in a state where the support plate overlaps the substrate. PTL 2 discloses an overlapping unit and an attachment apparatus which include a support unit configured to support a wafer or a support plate, and a transportation unit configured to transport the wafer or the support plate, and in which the support unit includes three or more columnar members having a first support portion configured to support an end portion of the wafer or the support plate, and a first positioning portion configured to guide the end portion to the first support portion.

CITATION LIST

Patent Literature

[PTL 1] Japanese Unexamined Patent Application, Publication No. 2007-158122 (published on Jun. 21, 2007)

[PTL 2] Japanese Unexamined Patent Application Publication No. 2008-182127 (published on Aug. 7, 2008)

SUMMARY OF INVENTION

Technical Problem

In the related art, an attachment failure occurs due to gas generated from a device substrate when a support body is attached to the device substrate, which is a problem. For example, when a polyimide film or the like is formed on the surface of the device substrate, the polyimide film absorbs moisture. Here, since the polyimide film absorbs all of the moisture even though the device substrate is baked in advance, when the support body is attached to the device substrate, an attachment failure may occur. When an adhesive layer is pre-heated before the support body is attached to the substrate after overlapping the support body over the substrate, the amount of gas generated from the polyimide film increases, and as a result, the support body may be deviated while being attached to the substrate.

The present invention is made in light of the problems, and an object of the present invention is to provide an attachment method of being able to obtain good attachment regardless of the type of substrate to which a support body is attached.

Solution to Problem

According to an aspect of the present invention, there is provided, in order to solve the problem, an attachment method of attaching a support body to a substrate via an adhesive layer, the method including: an overlapping step of overlapping the support body over the substrate under a reduced pressure environment via the adhesive layer formed on at least one of the substrate and the support body; a temporary fixing step of temporarily fixing the support body to the substrate via the adhesive layer by pressing partial regions of the support body toward the substrate under a reduced pressure environment after the overlapping step; an attaching step of attaching the support body to the substrate under a reduced pressure environment, both of which are temporarily fixed together via the adhesive layer; and prior to the overlapping step, at least one step of a first heating step of heating the substrate and the support body under an atmospheric pressure environment and a second heating step of heating the substrate and the support body under a reduced pressure environment.

Advantageous Effects of Invention

According to the attachment method of the present invention, good attachment can be obtained regardless of the type of substrate to which the support body is attached.

DESCRIPTION OF EMBODIMENTS

Hereinafter, an embodiment of the present invention will be described in detail.
[Attachment Method]
An attachment method of the present invention is an attachment method of attaching a support body to a substrate via an adhesive layer, the attachment method including: an overlapping step of overlapping the support body over the substrate under a reduced pressure environment via the adhesive layer formed on at least one of the substrate and the support body; a temporary fixing step of temporarily fixing the support body to the substrate via the adhesive layer by pressing partial regions of the support body toward the substrate under a reduced pressure environment after the overlapping step; an attaching step of attaching the support plate to the substrate under a reduced pressure environment, both of which are temporarily fixed together via the adhesive layer; and at least one step of a first heating step of heating the substrate and the support body under an atmospheric pressure environment prior to the overlapping step, and a second heating step of heating the substrate and the support body under a reduced pressure environment.

Figure 1:
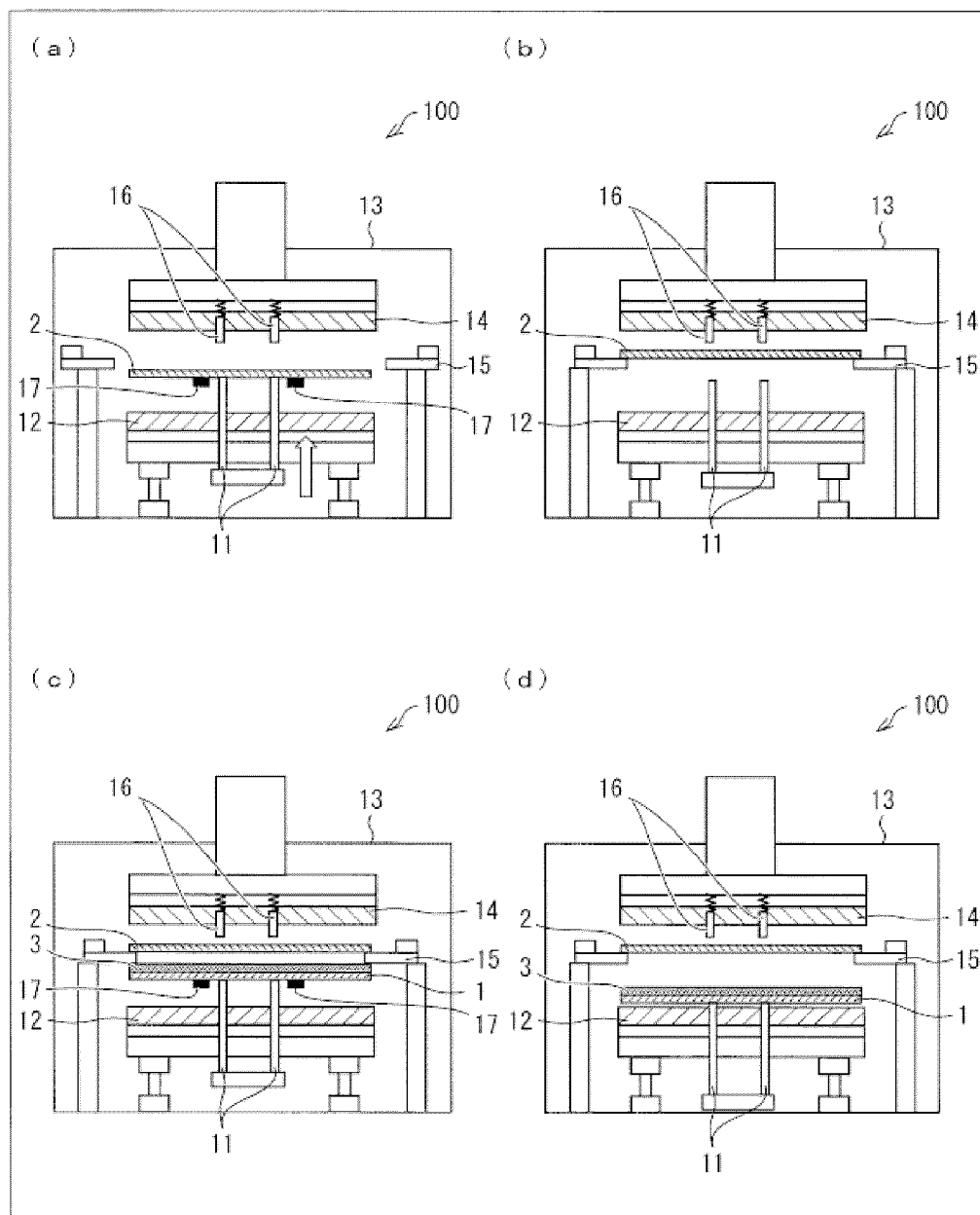
FIG. 1 is a view illustrating part (up to a first heating step) of steps for an attachment method according to an embodiment of the present invention.
Figure 2:
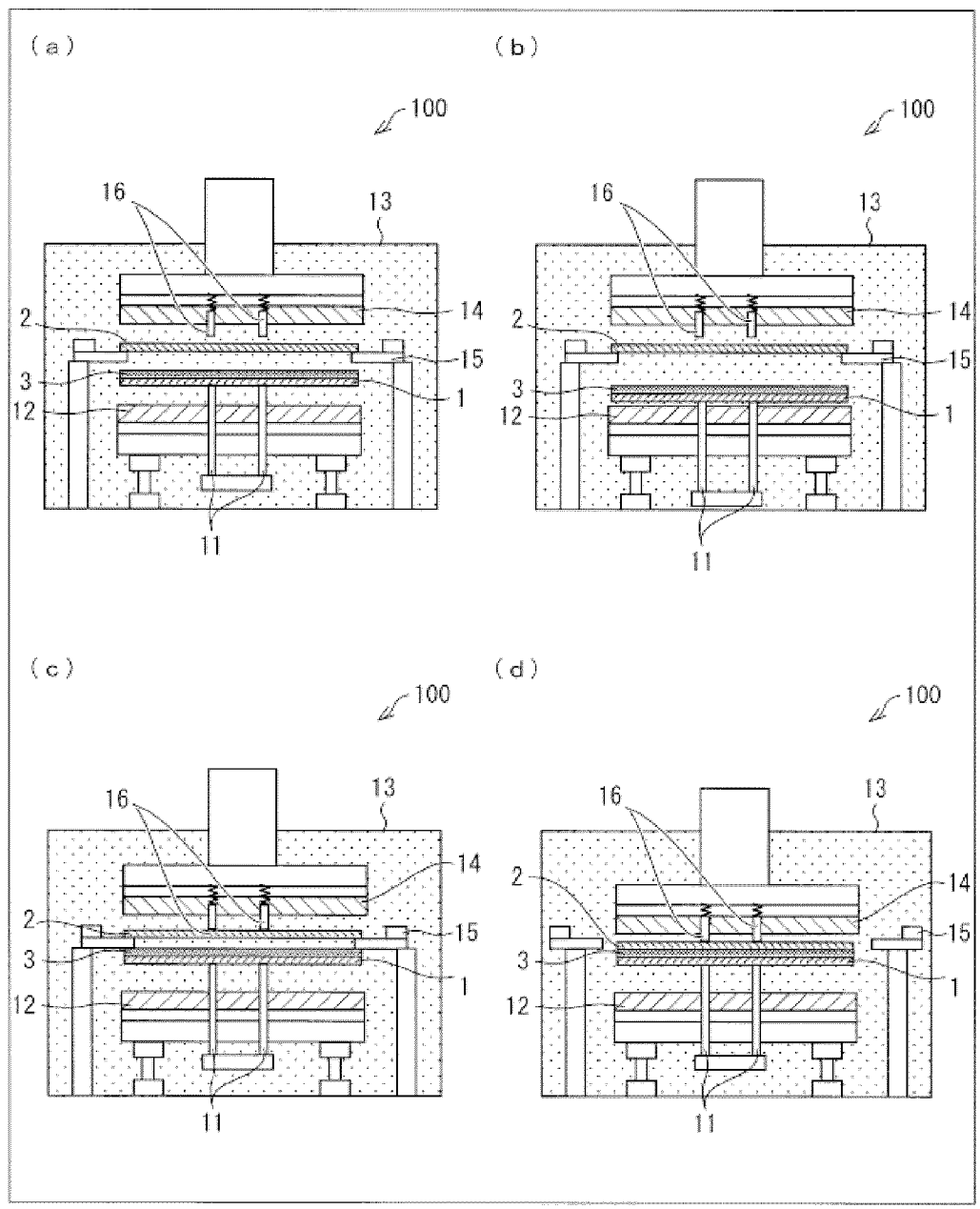
FIG. 2 is a view illustrating part (up to a temporary fixing step after the first heating step) of the steps for the attachment method according to the embodiment of the present invention.
Figure 3:
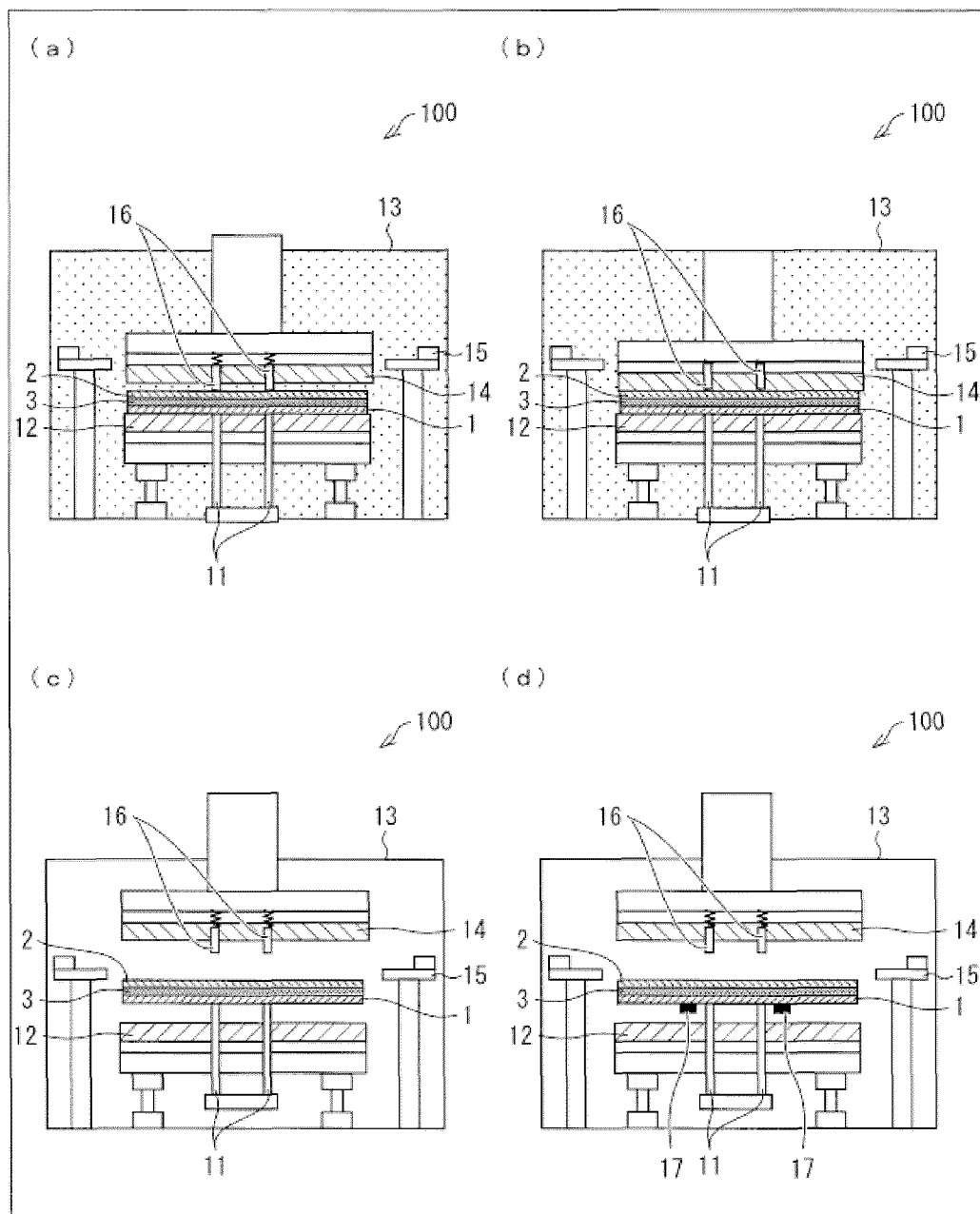
FIG. 3 is a view illustrating part (after the temporary fixing step) of the steps for the attachment method according to the embodiment of the present invention.

First, the configuration of an attachment apparatus 100 used for the attachment method according to the embodiment of the present invention will be described with reference to FIGS. 1 to 3. All of FIGS. 1 to 3 are views illustrating part of steps for the attachment method according to the embodiment of the present invention. In these drawings, FIG. 1 is a view illustrating steps up to a first heating step, FIG. 2 is a view illustrating steps up to a temporary fixing step after the first heating step, and FIG. 3 is a view illustrating steps after the temporary fixing step.
[Attachment Apparatus 100]
The attachment apparatus 100 includes a pin 11; a heater 12; a chamber 13; a presser 14; a spacer 15; and a spring member (biasing unit) 16. The attachment apparatus 100 is used to attach a support plate (support body) 2 to a substrate 1 via an adhesive layer 3 in the chamber 13.
(Substrate 1)
The support plate 2 is attached to the substrate 1 via the adhesive layer 3. The substrate 1 can be subjected to a thinning process, a mounting process, and the like in a state where the substrate 1 is supported by the support plate 2. The substrate 1 is not limited to a wafer substrate, and an arbitrary substrate such as a ceramic substrate, a thin film substrate, or a flexible substrate can be used as the substrate 1.
(Support Plate 2)
The support plate (support body) 2 is a support body configured to support the substrate 1, and is attached to the substrate 1 via the adhesive layer 3. For this reason, the support plate 2 preferably has the strength necessary for preventing the substrate 1 from being damaged or deformed when the substrate 1 is thinned, transported, or mounted. From this point of view, a plate made of glass, silicon, acrylic-based resin, or the like can be used as the support plate 2.
(Adhesive Layer 3)
The adhesive layer 3 works to attach the support plate 2 to the substrate 1, and is formed by coating an adhesive on the substrate 1. A method of coating an adhesive on the substrate 1 or the support plate 2 is not limited to a specific method, and spin coating, dipping, roller blade coating, spray coating, slit coating, or the like can be used as the coating method. In the embodiment, the adhesive layer 3 is formed on the substrate 1; however, the present invention is not limited to the case in which the adhesive layer 3 is formed on the substrate 1, and the adhesive layer 3 may be formed on the support plate 2.

An adhesive used for forming the adhesive layer 3 is not particularly limited as long as it is a thermoplastic adhesive material that has improved thermal fluidity when being heated. The thermoplastic adhesive material may be acrylic-based resin, styrene-based resin, maleimide-based resin, hydrocarbon-based resin, elastomer, or the like.

It is possible to appropriately set the thickness of the adhesive layer 3 depending on the type of the substrate 1 and the support plate 2 which are targets for attachment, and processes applied to the substrate 1 after the substrate 1 and the support plate 2 are adhered together, and the thickness is preferably set to 5 μm to 200 μm, and more preferably 10 μm to 150 μm.

Layers other than the adhesive layer 3 may be further formed between the substrate 1 and the support plate 2. For example, a release layer to be altered when irradiated with light may be formed between the support plate 2 and the adhesive layer 3. Accordingly, when the release layer is irradiated with light after the substrate 1 is thinned, transported, or mounted, the support plate 2 can be easily released from the substrate 1.

Depending on a wavelength absorbable by the release layer, the release layer may be appropriately irradiated with the following light: solid-state lasers such as a YAG laser, a libby laser, a glass laser, a YVO4 laser, an LD laser, and a fiber laser; a liquid laser such as a dye laser; gas lasers such as a CO2 laser, an excimer laser, an Ar laser, and a He—Ne laser; laser beams such as a semiconductor laser and a free electron laser; a non-laser beam; or the like. For example, a light wavelength to be absorbed by the release layer can be a light wavelength of 600 nm or less; however, the light wavelength is not limited to a light wavelength of 600 nm or less.

The release layer may contain a light absorber which is resolved by light or the like. The following light absorbers can be used: graphite powder; fine particulate metal powder made of metal such as iron, aluminum, copper, nickel, cobalt, manganese, chromium, zinc, or tellurium; metal oxide powder consisting of black titanium oxide; carbon black metal complex, aromatic diamino-based metal complex, aliphatic diamine-based metal complex, aromatic dithiol-based metal complex, mercaptophenol metal complex; a squarylium-based compound; and dyes or pigments having a cyanine color, a methine color, a naphthoquinone color, an anthraquinone color or the like. For example, it is possible to form such a release layer by mixing the release layer with binder resin and coating the resulting material on the support body. A layer made of resin having a light-absorption group can be used as the release layer.

An inorganic film or an organic film formed by a plasma CVD method may be used as the release layer. For example, a metal film can be used as an inorganic film. A fluorocarbon film can be used as an organic film. For example, it is possible to form such a reactive film on the support body using the plasma CVD method.

When the release layer is not formed, it is possible to release the support plate 2 from the substrate 1 by supplying a solvent to the adhesive layer 3 and dissolving the adhesive layer 3. At this time, a through hole is preferably formed in the support plate 2 in a direction of the thickness thereof because it is possible to easily supply the solvent to the adhesive layer 3 via the through hole.

(Pin 11)

The pin 11 supports the substrate 1 or the support plate 2 that is transported to the attachment apparatus 100. The pin 11 supports the substrate 1 while being in contact with a surface of the substrate 1, the surface not having the adhesive layer 3.

A plurality of the pins 11 are preferably provided so as to reliably support the substrate 1 or the support plate 2, and are more preferably provided in such a manner that the pins 11 contact with the substrate 1 or the support plate 2 at regular intervals.

In FIGS. 1 to 3, the pins 11 are provided to support the vicinity of the center of the substrate 1 or the support plate 2; however, the pins 11 may be provided to support end portions of the substrate 1 or the support plate 2.

The pins 11 are provided with a movement unit (not illustrated) for vertically moving the pins 11 in a state where the pins 11 support the substrate 1 or the support plate 2. A vertical movement of the pins 11 leads to a change in distance between the substrate 1 and the heater 12. For example, when the pins 11 move downwards to the heater 12, the surface (the surface without the adhesive layer 3) of the substrate 1 approaches the heater 12. For example, when the pins 11 move upwards to separate from the heater 12, the surface (the surface without the adhesive layer 3) of the substrate 1 separates from the heater 12. The pins 11 can move downwards until the substrate 1 comes into contact with the heater 12 (a pindown movement), or to a position in which the substrate 1 is not in contact with the heater 12 and is close to the heater 12 (a pinup movement). The pins 11 may move vertically while supporting the support plate 2, and the support plate 2 may be supported by the spacer 15.

(Heater 12)

The heater 12 heats the adhesive layer 3 by heating the substrate 1 supported by the pins 11 from the side (the side without the adhesive layer 3) thereof. In the embodiment, the heater 12 is provided in such a manner so as to face the surface (the surface without the adhesive layer 3) of the substrate 1; however, an installation position of the heater 12 is not limited to the position in the embodiment insofar as the heater 12 at the installation position can heat the adhesive layer 3.

The heater 12 is not limited to a specific configuration insofar as the heater 12 can heat the adhesive layer 3 when the pins 11 move downwards, and the substrate 1 approaches the heater 12. When the heater 12 is provided in such a manner so as to face the surface (the surface without the adhesive layer 3) of the substrate 1, preferably, the size of the heater 12 is substantially the same as or greater than that of the substrate 1 and the support plate 2. The followings are examples of the heater 12: a hot water heater; a hot air heater; an infrared heater; an electric heater; a film heater; or the like.

(Chamber 13)

In the chamber 13 of the attachment apparatus 100, each step up to attachment of the support plate 2 to the substrate 1 is performed. It is possible to bring the interior of the chamber 13 into a reduced pressure environment using a suction unit (not illustrated) or the like. The support plate 2 is attached to the substrate 1 in the chamber 13 in a reduced pressure environment.

(Presser 14)

The presser 14 works to press the support plate 2 against the substrate 1, and to attach the support plate 2 to the substrate 1 via the adhesive layer 3. In the embodiment, since the heater 12 is provided in such a manner so as to face the surface (the surface without the adhesive layer 3) of the substrate 1, the presser 14 presses the support plate 2 against the substrate 1 by pressing the substrate 1 and the support plate 2 against the heater 12.

(Spacer 15)

The spacer 15 is a support portion that supports the support plate 2 transported to the chamber 13. In the embodiment, as illustrated in FIGS. 1(*a*) and 1(*b*), a pair of the spacers 15 can move rightwards and leftwards, and the pins 11 supporting the support plate 2 move vertically, and thus the spacers 15 support end portions of the support plate 2, respectively.

(Spring Member 16)

The spring member 16 is a biasing unit that is deformed in response to a force applied thereto, and is provided on the presser 14. As illustrated in FIG. 2(*c*), when the presser 14 moves downwards toward the support plate 2 supported by the spacers 15, the spring member 16 comes into contact with the support plate 2. As illustrated in FIG. 2(*d*), when the presser 14 further moves downwards toward the support plate 2 supported by the spacers 15, the spring member 16 presses the support plate 2.

The spring member 16 can temporarily fix the substrate 1 and the support plate 2 together via the adhesive layer 3 by pressing partial regions of the support plate 2 toward the substrate 1 supported by the pins 11.

That is, the spring member 16 along with the pins 11 temporarily fixes the substrate 1 and the support plate 2 together via the adhesive layer 3. For this reason, the number of spring members 16 provided is preferably set to be the same as the number of pins 11 provided, and the spring members 16 are more preferably disposed in the attachment apparatus 100 in such a manner that the spring member 16 and the paired pin 11 are present on a straight line. Accordingly, the substrate 1 and the support plate 2 can be temporarily fixed together without being deviated from each other when the substrate 1 and the support plate 2 are temporarily fixed together via the adhesive layer 3.

A force of pressing the partial regions of the support plate 2 toward the substrate 1 may be adjusted by only the spring members 16, or may be adjusted by a combination of the spring members 16 and torque control. Accordingly, the press force can be further controlled with torque of a motor while the support plate 2 is pressed by the spring members 16. For this reason, it is possible to control a force of pressing the support plate 2 depending on the substrate 1 to which the support plate 2 is attached, the release layer formed on the support plate 2, or the adhesive.

Figure 4:
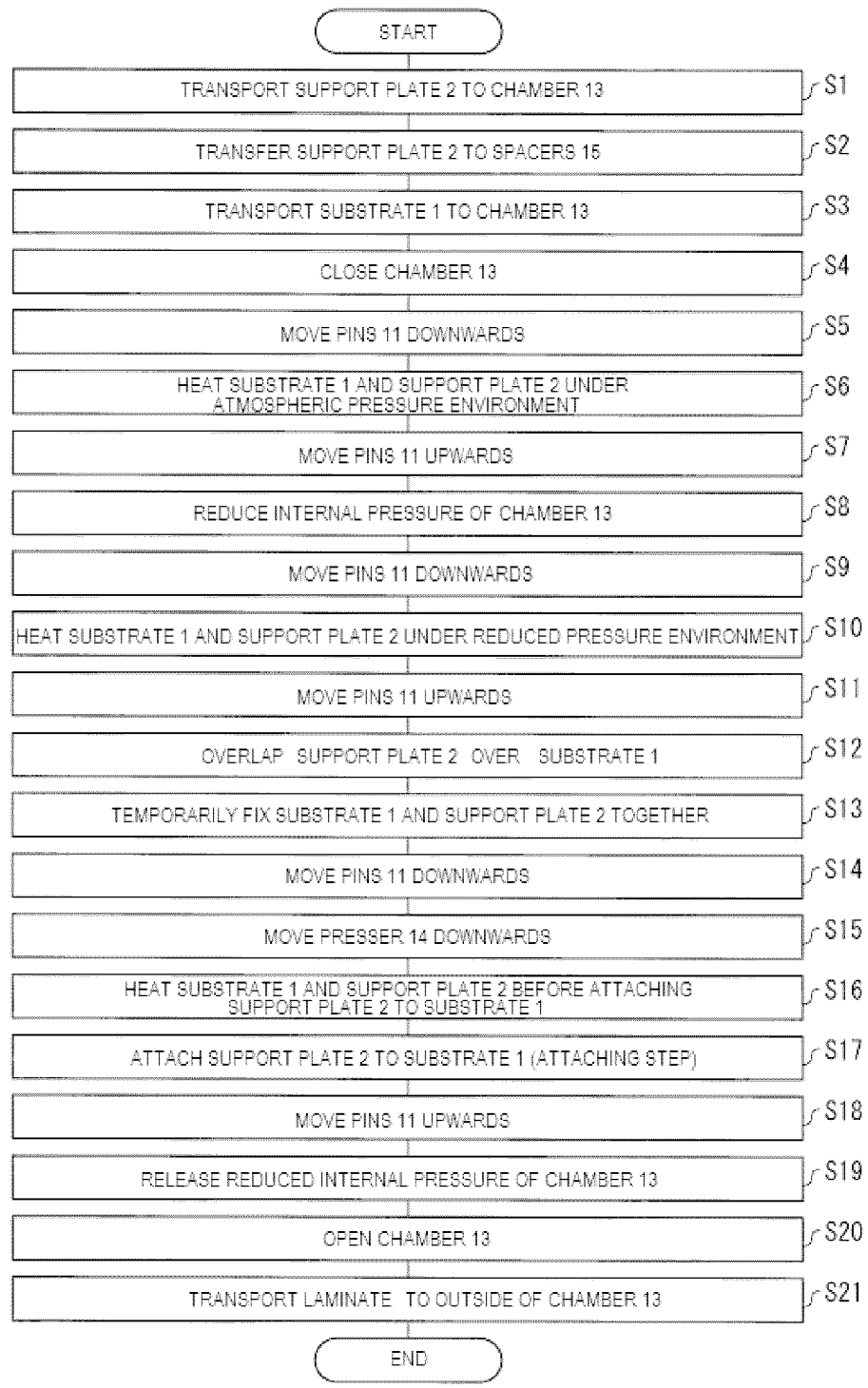
FIG. 4 is a sequence diagram illustrating procedures of a process for the attachment method according to the embodiment of the present invention.

Hereinafter, the attachment method according to the embodiment of the present invention will be described with reference to FIGS. 1 to 4. FIG. 4 is a sequence diagram illustrating procedures of a process for the attachment method according to the embodiment of the present invention.

First, as illustrated in FIG. 1(*a*), the support plate 2 is transported into the attachment apparatus 100 (into the chamber 13) while being supported by a transportation unit 17 (step S1). The pins 11 support the support plate 2 transported into the attachment apparatus 100. When the release layer is formed on the support plate 2, the pins 11 support the support plate 2 in such a manner that a surface (surface with the release layer) of the support plate 2 is in contact with the pins 11.

The pair of spacers 15 moves rightwards and leftwards while the pins 11 supporting the support plate 2 move upwards. Accordingly, as illustrated in FIG. 1(*b*), the transported support plate 2 is transferred to the pair of spacers 15 (step S2).

Subsequently, as illustrated in FIG. 1(*c*), the substrate 1 with the adhesive layer 3 is transported into the attachment apparatus 100 while being supported by the transportation unit 17 (step S3). The pins 11 support the substrate 1 transported into the attachment apparatus 100 in such a manner that the surface (the surface without the adhesive layer 3) of the substrate 1 is in contact with the pins 11.

The pins 11 support the substrate 1 transported into the attachment apparatus 100, and the transportation unit 17 moves the outside of the attachment apparatus 100. Thereafter, the chamber 13 is closed by closing an open opening (not illustrated) of the chamber 13 (step S4).

The pins 11 supporting the substrate 1 move downwards, and the substrate 1 approaches the heater 12 (step S5). At this time, the pins 11 preferably move downwards to a position in which the substrate 1 is close to the heater 12 without being in contact therewith (a pinup movement). Accordingly, it is possible to prevent the substrate 1 from sliding against the surface of the heater 12 during the heating of the substrate 1.

Subsequently, as illustrated in FIG. 1 (*d*), the substrate 1 and the support plate 2 are heated under an atmospheric pressure environment (first heating step and step S6).

In the first heating step, it is possible to remove the remaining solvent or moisture on the substrate 1 by heating the substrate 1 and the support plate 2 under the atmospheric pressure environment. As a result, when the support plate 2 is overlapped over the substrate 1 via the adhesive layer 3, or when the support plate 2 is attached to the substrate 1 via the adhesive layer 3, it is possible to prevent evaporation of the solvent or the generation of water vapor, and to prevent the substrate 1 from experiencing an attachment failure.

In addition, since it is possible to improve the thermal fluidity of the adhesive layer 3 on the substrate 1 by performing the first heating step, it is possible to easily deform the adhesive layer 3 via pressing. For this reason, it is possible to reduce an amount of time required to attach the support plate 2 to the substrate 1.

In the first heating step, the substrate 1 is preferably heated up to a temperature greater than the boiling point of each of the solvent for the adhesive and water vapor, and when an improvement in the fluidity of the adhesive is taken into consideration, the substrate 1 is more preferably heated up to a temperature greater than or equal to a glass transition temperature (Tg) of the adhesive layer 3.

In the first heating step, it is possible to change heating conditions for the substrate 1 depending on the type of adhesive used in the adhesive layer 3, the distance between the heater 12 and the substrate 1, or the like, and for example, a heating temperature is preferably set to 40° C. or greater and 250° C. or less, and a heating time is preferably set to 5 seconds or greater and 5 minutes or less.

After the substrate 1 and the support plate 2 are heated in step S6, the pins 11 supporting the substrate 1 move upwards (step S7). Subsequently, as illustrated in FIG. 2(*a*), an internal pressure of the chamber 13 is reduced (step S8).

When the internal pressure of the chamber 13 is reduced in step S8, the internal pressure is preferably reduced to a pressure of 0.1 Pa or greater and 3000 Pa or less.

After the internal pressure of the chamber 13 is reduced, the pins 11 supporting the substrate 1 move downwards (step S9).

Subsequently, as illustrated in FIG. 2 (*b*), the substrate 1 and the support plate 2 are heated under a reduced pressure environment (second heating step, step S10).

In the second heating step, it is possible to remove the remaining solvent or moisture on the substrate 1 which cannot be removed in the first heating step by heating the substrate 1 and the support plate 2 under the reduced pressure environment. As a result, when the support plate 2 is overlapped over the substrate 1 via the adhesive layer 3, or when the support plate 2 is attached to the substrate 1 via the adhesive layer 3, it is possible to prevent evaporation of the solvent or the generation of water vapor, and to prevent the substrate 1 from experiencing an attachment failure.

In addition, by virtue of performing the second heating step, it is possible to improve the thermal fluidity of the adhesive layer 3 formed on the substrate 1, to easily deform the adhesive layer 3 via pressing, and to reduce an amount of time required to attach the support plate 2 to the substrate 1. In the present invention, it is not necessary to perform both the first heating step and the second heating step, and only one need be performed.

In the second heating step, the substrate 1 is preferably heated up to a temperature greater than the boiling point of each of the solvent for the adhesive and water vapor, and when an improvement in the fluidity of the adhesive is taken into consideration, the substrate 1 is more preferably heated up to a temperature greater than or equal to the glass transition temperature (Tg) of the adhesive layer 3.

In the second heating step, it is possible to change heating conditions for the substrate 1 depending on the type of adhesive used in the adhesive layer 3, the distance between the heater 12 and the substrate 1, or the like, and for example, a heating temperature is preferably set to 40° C. or greater and 250° C. or less, and a heating time is preferably set to 5 seconds or greater and 5 minutes or less.

In the second heating step in which the substrate 1 and the support plate 2 are heated under a reduced pressure environment, the substrate 1 and the support plate 2 are preferably heated under a reduced pressure environment of 0.1 Pa or greater and 3000 Pa or less. Accordingly, it is possible to satisfactorily remove the evaporated solvent or water vapor generated from the substrate 1.

After the substrate 1 and the support plate 2 are heated in step S10, the pins 11 supporting the substrate 1 move upwards (step S11).

Subsequently, as illustrated in FIG. 2(*c*), the support plate 2 is overlapped over the substrate 1 via the adhesive layer 3 under a reduced pressure environment (overlapping step, step S12). At this time, the pins 11 supporting the substrate 1 move upwards, and the presser 14 equipped with the spring members 16 moves downwards. Accordingly, the spring members 16 come into contact with part of the support plate 2, and press the part, and thereby it is possible to overlap the support plate 2 over the substrate 1 via the adhesive layer 3. When the support plate 2 is overlapped over the substrate 1, the spacers 15 move rightwards and leftwards, and release the support plate 2 therefrom.

Since the overlapping step is performed under the reduced pressure environment, it is possible to prevent air bubbles from entering the gap between the support plate 2 and the adhesive layer 3 when the support plate 2 is overlapped over the substrate 1 via the adhesive layer 3.

The overlapping step is preferably performed under a reduced pressure environment adjusted to a pressure of 0.1 Pa or greater and 3000 Pa or less. Accordingly, it is possible to satisfactorily prevent air bubbles from entering the gap between the support plate 2 and the adhesive layer 3.

After the overlapping step is completed, as illustrated in FIG. 2 (d), the support plate 2 is temporarily fixed to the substrate 1 via the adhesive layer 3 (temporary fixing step, step S13). At this time, the presser 14 moves further downwards, and thereby the spring members 16 press the partial regions of the support plate 2 toward the substrate 1 under a reduced pressure environment. Accordingly, it is possible to temporarily fix the support plate 2 to the substrate 1 via the adhesive layer 3 at the pressed partial regions of the support plate 2. Since the substrate 1 and the support plate 2 are temporarily fixed together via the adhesive layer 3, it is possible to prevent the substrate 1 and the support plate 2 from being deviated relative to each other. For this reason, it is possible to transport the substrate 1 temporarily fixed to the support plate 2 to another attachment apparatus, and to attach the support plate 2 to the substrate 1 in the other attachment apparatus.

In the temporary fixing step, a force of pressing the partial regions of the support plate 2 toward the substrate 1 may be adjusted by a combination of the spring members (biasing unit) and torque control.

After the temporary fixing step is completed, the pins 11 supporting the substrate 1 move downwards, the substrate being temporarily fixed to the support plate 2 (step S14). After the pins 11 move downwards, and the substrate 1 comes into contact with the heater 12, the presser 14 moves downwards, and the spring members 16 come into contact with the support plate 2 (step S15). The spring members 16 press the partial regions of the support plate 2 toward the substrate 1 under a reduced pressure environment.

Subsequently, as illustrated in FIG. 3(a), before the support plate 2 is attached to the substrate 1, both of which are temporarily fixed together, the substrate 1 and the support plate 2 are heated (third heating step, step S16).

By virtue of performing the third heating step, it is possible to improve the thermal fluidity of the adhesive layer 3 formed on the substrate 1, to easily deform the adhesive layer 3 via pressing, and to reduce an amount of time required to attach the support plate 2 to the substrate 1.

In the third heating step, the substrate 1 is preferably heated until the temperature of the adhesive layer 3 reaches the glass transition temperature or higher, and the substrate 1 is more preferably heated up to a temperature at least 10° C. greater than the glass transition temperature. The heating of the adhesive layer 3 up to a temperature greater than or equal to the glass transition temperature improves the thermal fluidity of the adhesive layer 3, and easily deforms the adhesive layer 3.

In the third heating step, it is possible to change heating conditions for the substrate 1 depending on the type of adhesive used in the adhesive layer 3, and for example, a heating temperature is preferably set to 40° C. or greater and 250° C. or less, and a heating time is preferably set to 5 seconds or greater and 5 minutes or less.

In the third heating step, the substrate 1 and the support plate 2 temporarily fixed together are preferably heated while adjusting the force of pressing the partial regions of the support plate 2 toward the substrate 1 via the spring members 16. The force of pressing the partial regions of the support plate 2 toward the substrate 1 may be adjusted by torque control.

When the solvent or moisture cannot be satisfactorily removed in the first heating step or the second heating step, and remains on the substrate 1, in the third heating step, the solvent evaporates, or water vapor is generated, and thereby the support plate 2 may be deviated while being attached to the substrate 1, which is a problem. However, since the force of pressing the partial regions of the support plate 2 toward the substrate 1 is adjusted by the spring members 16 or torque control, the partial regions of the support plate 2 are continuously pressed toward the substrate 1. For this reason, even when the solvent evaporates or water vapor is generated, the overlapped substrate 1 and support plate 2 are not deviated from each other. Accordingly, it is possible to prevent the support plate 2 from being attached to the substrate 1 in a state where the support plate 2 is deviated from the substrate 1.

After the third heating step is completed, as illustrated in FIG. 3(b), the support plate 2 is attached to the substrate 1 under a reduced pressure environment, both of which are temporarily fixed together via the adhesive layer 3 (attaching step, step S17). At this time, the presser 14 moves further downwards, and presses the support plate 2 and the substrate 1 via one surface of the support plate 2, which is on an opposite side of the other surface facing the adhesive layer 3. Since the presser 14 presses the substrate 1 and the support plate 2 against the heater 12, it is possible to form a laminate in which the support plate 2 is attached to the substrate 1 via the adhesive layer 3. Since the attaching step is performed under the reduced pressure environment, it is possible to prevent air bubbles from entering the gap between the adhesive layer 3 and the support plate 2, and to satisfactorily attach the support plate 2 to the substrate 1.

It is possible to change press conditions when pressing the substrate 1 and the support plate 2 against each other depending on the type of adhesive used to form the adhesive layer 3, and pressure is preferably set to 50 kg or greater and 15000 kg or less, and more preferably 100 kg or greater and 10000 kg or less.

In the attaching step, when the support plate 2 is attached to the substrate 1, the support plate 2 is preferably pressed against the substrate 1 while both are heated by the heater 12. Since the support plate 2 is pressed against the substrate 1 while both are heated, it is possible to maintain the thermal fluidity of the adhesive layer 3, and to easily deform the adhesive layer 3 via pressing. Depending on the type of adhesive used to form the adhesive layer 3, it is possible to change the press conditions when pressing the support plate 2 against the substrate 1 during heating. The support plate 2 is preferably pressed against the substrate 1 at a pressure of 50 kg or greater and 15000 kg or less for 0.5 minutes or greater to 10 minutes or less while both are heated at a temperature of 60° C. or greater and 300° C. or less, and more preferably at a pressure of 100 kg or greater and 10000 kg or less and at a temperature of 100° C. or greater and 250° C. or less.

In the embodiment, since the substrate 1 with the adhesive layer 3 formed thereon in advance is heated in the first, the second, and the third heating steps before the support plate 2 is attached to the substrate 1, the thermal fluidity of the adhesive layer 3 improves, and the adhesive layer 3 between the substrate 1 and the support plate 2 is uniformly spread via pressing. Accordingly, it is possible to uniformly attach the support plate 2 to the substrate 1.

In the attaching step, the support plate 2 is preferably attached to the substrate 1 under a reduced pressure environment of 0.1 Pa or greater and 10 Pa or less, the substrate 1 and the support plate 2 being temporarily fixed together via the adhesive layer 3. Accordingly, it is possible to satisfactorily prevent air bubbles from entering the gap between the adhesive layer 3 and the support plate 2, and to more satisfactorily attach the support plate 2 to the substrate 1.

After the attaching step is completed, the pins 11 supporting the laminate move upwards (step S18). Thereafter, as illustrated in FIG. 3(c), the reduced pressure environment in the attachment apparatus 100 is released (step S19). The opening is opened and the chamber 13 is exposed to the atmospheric pressure conditions (step S20).

Subsequently, as illustrated in FIG. 3(d), the laminate is supported by the transportation unit 17, and is transported to the outside of the attachment apparatus 100 (the chamber 13) (step S21).

In the overlapping step in which the support plate 2 is overlapped over the substrate 1 via the adhesive layer 3 under the reduced pressure environment, a pressure environment when overlapping the support plate 2 over the substrate 1 is preferably adjusted depending on the type of the substrate 1 or the adhesive layer 3.

When the release layer is formed on the support plate 2, and the support plate 2 is overlapped over the substrate 1 via the release layer and the adhesive layer 3, a scratch may occur on the release layer. However, it is possible to prevent a scratch from occurring on the release layer by adjusting the internal pressure of the attachment apparatus 100 depending on the type of the substrate 1 or the adhesive layer 3 in the overlapping step. For example, the overlapping step is preferably performed under a reduced pressure environment adjusted to 0.1 Pa or greater and 3000 Pa or less.

With the following examples, the embodiment of the present invention will be described in more detail. Naturally, the present invention is not limited to the following examples, and can be realized with various forms of details. The present invention is not limited to the embodiment, and various modifications can be made to the present invention within the scope of the claims, and a technological scope of the present invention also includes embodiments that are obtained by appropriately combining the disclosed technological means. All of the cited literatures in this specification are incorporated hereinto by reference.

EXAMPLES

Example 1

An adhesive layer having a thickness of 50 μm was formed by coating an adhesive (brand name: "TZNR (registered trademark)-A3007t" and made by Tokyo Ohka Kogyo Co., Ltd.) on a wafer substrate (a 12 inch Si wafer substrate) and baking the coated wafer substrate at 100° C., 160° C., and 220° C. for 4 minutes each.

Subsequently, the wafer substrate with the adhesive layer and a support plate (a 12 inch glass substrate) were set in a chamber. The internal pressure of the chamber was reduced (vacuum level of 3000 Pa). After pins supporting the wafer substrate with the adhesive layer moved downwards, and came into contact with a heater, the wafer substrate with the adhesive layer and the support plate were heated at 215° C. for 5 minutes.

The pins supporting the wafer substrate moved upwards, and the support plate is overlapped over the wafer substrate via the adhesive layer under a reduced pressure environment (vacuum level of 3000 Pa).

After the support plate is overlapped over the wafer substrate, the wafer substrate and the support plate were temporarily fixed together via the adhesive layer under a reduced pressure environment (vacuum level of 3000 Pa).

Thereafter, a laminate was formed by pressing the support plate against the wafer substrate with the adhesive layer at an attachment temperature of 215° C. and an attachment pressure of 4000 kg for 90 seconds, and attaching the support plate to the wafer substrate via the adhesive layer under a reduced pressure environment (vacuum level of 3000 Pa). It was confirmed whether there was an attachment failure present in the formed laminate. It was confirmed that there was no attachment failure on the laminate according to Example 1.

It was determined whether there was an attachment failure by observing whether there is a void present in the substrate with the naked eye and an optical microscope.

It was also confirmed that the support plate was attached to the wafer substrate without being deviated from the wafer substrate in the laminate according to Example 1. In this example, since the wafer substrate and the support plate were temporarily fixed together via the adhesive layer before the support plate was attached to the wafer substrate, the support plate was attached to the wafer substrate without being deviated from the wafer substrate.

Example 2

In this example, a laminate was formed according to the same procedures and conditions as those in Example 1 by using a substrate with a polyimide film as a substrate to which a support plate is attached. It was confirmed whether there was an attachment failure in the formed laminate. It was confirmed that there was no attachment failure in the laminate according to Example 2.

Comparative Example 1

In this comparative example, a laminate was formed according to the same procedures and conditions as those in Example 1 except that a wafer substrate with an adhesive layer and a support plate were not heated before the overlapping step was performed. It was confirmed whether there was an attachment failure in the formed laminate. It was confirmed that there was no attachment failure in the laminate according to this comparative example.

Comparative Example 2

In this comparative example, a laminate was formed according to the same procedures and conditions as those in Example 2 except that a wafer substrate with an adhesive layer and a support plate were not heated before the overlapping step was performed. It was confirmed whether there was an attachment failure in the formed laminate. It was confirmed that there was an attachment failure in the laminate according to this comparative example.

Consideration of Example 1, Example 2, Comparative Example 1 and Comparative Example 2

As illustrated in Example 1 and Example 2, when the substrate with the adhesive layer and the support plate were heated prior to the overlapping step being performed, an attachment failure did not occur regardless of the type of substrate.

In contrast, as illustrated in Comparative Example 1 and Comparative Example 2, when the substrate with the adhesive layer and the support plate were not heated prior to the overlapping step being performed, an attachment failure did not occur in the wafer substrate, and an attachment failure occurred in the substrate with the polyimide film. It was considered that an attachment failure occurred because moisture absorbed by the polyimide film vaporized therefrom when the support plate was attached to the substrate.

As a result of evaluating these examples and comparative examples, the following finding was obtained: when the substrate with the adhesive layer and the support plate were not heated prior to the overlapping step being performed, an attachment failure might occur depending on the type of substrate, and in contrast, when the substrate with the adhesive layer and the support plate were heated prior to the overlapping step being performed, it was possible to prevent an occurrence of an attachment failure regardless of the type of substrate.

Example 3

In this example, a laminate was formed according to the same procedures and conditions as those in Example 1 except that a release layer (a fluorocarbon layer) was formed on a support plate, and the support plate was attached to a wafer substrate via the release layer and an adhesive layer. It was confirmed whether there was a scratch in the release layer of the formed laminate. It was confirmed that there was no scratch in the release layer of the formed laminate according to Example 3.

The fluorocarbon film, that is, the release layer was formed on a 12 inch glass substrate by installing the glass substrate in a chamber of a plasma process apparatus, and exposing the glass substrate to reactant gas C4F8 under conditions (at a flow rate of 400 sccm, a pressure of 700 mTorr, high-frequency power of 2800 W, and a deposition temperature of 240° C.) using a plasma CVD method.

Example 4

In this example, a laminate was formed according to the same procedures and conditions as those in Example 3 except for using an adhesive (brand name: "TZNR (registered trademark)-A4005" and made by Tokyo Ohka Kogyo Co., Ltd.) different from the adhesive (brand name: "TZNR (registered trademark)-A3007t") used in Example 3. It was confirmed whether there was a scratch in a release layer of the formed laminate. It was confirmed that there was no scratch in the release layer of the formed laminate according to Example 4.

Example 5

In this example, a laminate was formed according to the same procedures and conditions as those in Example 3 except that each step was performed under a highly reduced pressure environment (vacuum level of 10 Pa). It was confirmed whether there was a scratch in a release layer of the formed laminate. It was confirmed that there was no scratch in the release layer of the formed laminate according to Example 5.

Example 6

In this example, a laminate was formed according to the same procedures and conditions as those in Example 5 except for using an adhesive (brand name: "TZNR (registered trademark)-A4005" and made by Tokyo Ohka Kogyo Co., Ltd.) different from the adhesive (brand name: "TZNR (registered trademark)-A3007t") used in Example 5. It was confirmed whether there was a scratch in a release layer of the formed laminate. It was confirmed that there was a scratch in the release layer of the formed laminate according to Example 6.

Consideration of Examples 3 to 6

As illustrated in Example 3 and Example 4, when the wafer substrate with the adhesive layer and the support plate were heated under the reduced pressure environment (vacuum level of 3000 Pa), there was no scratch in the release layer regardless of the type of adhesive.

In contrast, as illustrated in Example 5 and Example 6, when the wafer substrate with the adhesive layer and the support plate were heated under the highly reduced pressure environment (vacuum level of 10 Pa), there was a scratch in the release layer depending on the type of adhesive.

As a result of evaluating these examples, the following finding was obtained: since a scratch occurred in the release layer depending on the type of adhesive under a highly reduced pressure environment of a vacuum level of 10 Pa or less, the wafer substrate with the adhesive layer and the support plate were preferably heated under a reduced pressure environment of a vacuum level of approximately 3000 Pa so as to prevent a scratch from occurring in the release layer.

Example 7

In this example, a laminate was formed using a device B substrate (a substrate coated with a mold material) as a substrate to which a support plate is attached, according to the same procedures and conditions as those in Example 1. In the laminate according to this example, it was confirmed that the support plate was attached to the device B substrate without being deviated from the device B substrate. In this example, since the device B substrate and a support plate were temporarily fixed together via an adhesive layer before the support plate was attached to the device B substrate, the support plate was not deviated while being attached to the device B substrate.

Comparative Example 3

In this comparative example, a laminate was formed according to the same procedures and conditions as those in Example 1 except that the temporary fixing step was not performed. In the laminate according to this example, it was confirmed that a support plate was attached to the wafer substrate without being deviated from the wafer substrate. In this example, the wafer substrate and the support plate were not temporarily fixed together via an adhesive layer before the support plate was attached to the wafer substrate; however, the support plate was attached to the wafer substrate without being deviated from the wafer substrate.

Comparative Example 4

In this comparative example, a laminate was formed according to the same procedures and conditions as those in Example 3 except for using the device B substrate as a substrate to which a support plate is attached. In the laminate according to this comparative example, it was confirmed that the support plate was attached to the device B substrate without being deviated from the device B substrate. In this comparative example, since the device B substrate and the support plate were not temporarily fixed together via an adhesive layer before the support plate was attached to the device B substrate, the support plate was deviated while being attached to the device B substrate.

Consideration of Example 1, Example 7,
Comparative Example 3 and Comparative Example 4

As illustrated in Example 1 and Example 7, when the temporary fixing step was performed before the support plate was attached to the substrate via the adhesive layer, the support plate was attached to the substrate without being deviated from the substrate regardless of the type of substrate.

In contrast, as illustrated in Comparative Example 3 and Comparative Example 4, when the temporary fixing step was not performed before the support plate was attached to the substrate via the adhesive layer, the support plate was attached to the wafer substrate without being deviated from the substrate, and in contrast, the support plate was deviated while being attached to the device B substrate.

As a result of evaluating these examples and comparative examples, the following finding was obtained: when the temporary fixing step was not performed, the support plate might be deviated while being attached to the substrate depending on the type of substrate, and in contrast, when the temporary fixing step was performed, it was possible to prevent an occurrence of deviation in the attachment of the substrate and the support plate regardless of the type of substrate.

INDUSTRIAL APPLICABILITY

The present invention can be widely used in a manufacturing process of a miniaturized semiconductor apparatus.

REFERENCE SIGNS LIST 1 substrate
2 support plate (support body)
3 adhesive layer
11 pin
12 heater
13 chamber
14 presser
15 spacer
16 spring member (biasing unit)
17 transportation unit
100 attachment apparatus

The invention claimed is:

1. An attachment method of attaching a support body to a substrate via an adhesive layer,
a release layer to be altered when irradiated with light being formed on the support body,
the method comprising:
overlapping the support body over the substrate under a reduced pressure environment via the release layer and the adhesive layer;
temporarily fixing the support body to the substrate via the release layer and the adhesive layer by pressing partial regions of the support body toward the substrate under a reduced pressure environment after the overlapping;
attaching the support body to the substrate under a reduced pressure environment, both of which are temporarily fixed together via the release layer and the adhesive layer; and
prior to the overlapping, (i) both heating the substrate and the support body under an atmospheric pressure environment and heating the substrate and the support body under a reduced pressure environment or (ii) heating the substrate and the support body under a reduced pressure environment,
wherein:
the overlapping is performed under a reduced pressure environment adjusted to a pressure of 0.1 Pa or greater and 3000 Pa or less; and
the substrate and the support body are heated under a reduced pressure environment of 3000 Pa or less.

2. The attachment method according to claim 1, wherein in the overlapping, a pressure environment for overlapping the support body over the substrate is adjusted depending on the type of the substrate or the adhesive layer.

3. The attachment method according to claim 1, wherein in the attaching, the support body is attached to the substrate under a reduced pressure environment of 10 Pa or less, both of which are temporarily fixed together via the release layer and the adhesive layer.

4. The attachment method according to claim 1, wherein in the temporary fixing, a force of pressing the partial regions of the support body toward the substrate is adjusted by a biasing unit or torque control.

5. The attachment method according to claim 1, further comprising,
heating the substrate and the support body temporarily fixed together after the temporary fixing and prior to the attaching.

6. The attachment method according to claim 5, wherein the substrate and the support body temporarily fixed together are heated while a force of pressing the partial regions of the support body toward the substrate is adjusted by a biasing unit.

7. An attachment method of attaching a support body to a substrate via an adhesive layer,
a release layer to be altered when irradiated with light being formed on the support body,
the method comprising:
overlapping the support body over the substrate under a reduced pressure environment via the release layer and the adhesive layer;
temporarily fixing the support body to the substrate via the release layer and the adhesive layer by pressing partial regions of the support body toward the substrate, which is supported by a plurality of pins, under a reduced pressure environment after the overlapping;
attaching the support body to the substrate under a reduced pressure environment, both of which are temporarily fixed together via the release layer and the adhesive layer; and
prior to the overlapping, at least one of a (i) heating the substrate and the support body under an atmospheric pressure environment and (ii) heating the substrate and the support body under a reduced pressure environment,
wherein the overlapping is performed under a reduced pressure environment adjusted to a pressure of 0.1 Pa or greater and 3000 Pa or less.

8. The attachment method according to claim 7, wherein a pressure environment for overlapping the support body over the substrate is adjusted depending on the type of the substrate or the adhesive layer.

9. The attachment method according to claim 7, wherein the substrate and the support body are heated under a reduced pressure environment of 3000 Pa or less.

10. The attachment method according to claim 7, wherein the support body is attached to the substrate under a reduced pressure environment of 10 Pa or less, both of which are temporarily fixed together via the release layer and the adhesive layer.

11. The attachment method according to claim 7, wherein in the temporary fixing, a force of pressing the partial regions of the support body toward the substrate is adjusted by a spring member or torque control.

12. The attachment method according to claim 7, further comprising heating the substrate and the support body temporarily fixed together after the temporary fixing and prior to the attaching.

13. The attachment method according to claim 12, wherein the substrate and the support body temporarily fixed together are heated while a force of pressing the partial regions of the support body toward the substrate is adjusted by a spring member.

* * * * *